United States Patent [19]
Thomson et al.

[11] Patent Number: 6,133,753
[45] Date of Patent: Oct. 17, 2000

[54] TRI-STATE INPUT DETECTION CIRCUIT

[75] Inventors: David Thomson, Fremont, Calif.; Paul Sheridan, Monaleen; John Cleary, Fermoy, both of Ireland

[73] Assignee: Analog Devices, Inc., Norwood, Mass.

[21] Appl. No.: 09/200,316

[22] Filed: Nov. 25, 1998

[51] Int. Cl.[7] ............................ H03K 19/00; H03K 19/02
[52] U.S. Cl. .................................................. 326/56; 326/60
[58] Field of Search ........................... 326/60, 59, 56–58; 327/74, 75, 76

[56] References Cited

U.S. PATENT DOCUMENTS

| | | | |
|---|---|---|---|
| 4,100,429 | 7/1978 | Adachi | 326/60 |
| 4,449,065 | 5/1984 | Davies, Jr. | 307/473 |
| 4,465,944 | 8/1984 | Shin | 326/50 |
| 5,194,766 | 3/1993 | Sugawara | 326/60 |
| 5,598,110 | 1/1997 | Chang | 326/60 |
| 5,714,892 | 2/1998 | Bowers et al. | 326/60 |

*Primary Examiner*—Michael Tokar
*Assistant Examiner*—Daniel D. Chang
*Attorney, Agent, or Firm*—Koppel & Jacobs

[57] ABSTRACT

A tri-state input detection circuit produces two binary outputs that indicate whether a tri-state input signal is high, low, or in a hi-impedance state. A pair of transistors conduct a current in response to a tri-state signal presented at an input node. Circuitry is provided to pull the input node to a known voltage when the input signal is in its hi-Z state. The transistors are series-connected to respective current sources, with the junctions between the transistors and their current sources forming the circuit's binary outputs. The output impedances of the current sources are made less than those of their respective transistors, so that when turned on by the input signal, a transistor pulls its associated output high or low. The circuit produces a unique binary output for each of the three input signal states. In a preferred embodiment, sampling pulses briefly activate the circuit, and downstream circuitry latches the circuit's outputs, reducing current consumption to zero except during the sampling period.

15 Claims, 5 Drawing Sheets

| $V_{in}$ | A | B |
|---|---|---|
| 0 | 1 | 1 |
| 1 | 0 | 0 |
| HI-Z | 1 | 0 |

| BUS 1 | BUS 2 | A | B | C | D |
|---|---|---|---|---|---|
| 0 | 0 | 1 | 1 | 1 | 1 |
| 0 | 1 | 1 | 1 | 0 | 0 |
| 0 | Z | 1 | 1 | 1 | 0 |
| 1 | 0 | 0 | 0 | 1 | 1 |
| 1 | 1 | 0 | 0 | 0 | 0 |
| 1 | Z | 0 | 0 | 1 | 0 |
| Z | 0 | 1 | 0 | 1 | 1 |
| Z | 1 | 1 | 0 | 0 | 0 |
| Z | Z | 1 | 0 | 1 | 0 |

FIG.5b

TRI-STATE INPUT DETECTION CIRCUIT

BACKGROUND OF THE INVENTION

1. Field of the Invention

This invention relates to the field of input level detection circuits, and particularly to circuits for detecting the state of a tri-state input signal.

2. Description of the Related Art

A "tri-state" signal is a digital logic signal that can assume three possible states: a logic "high" state, a logic "low" state, and a "high-impedance (hi-Z) state". In its hi-Z state, a tri-state signal presents a high impedance to the circuitry which receives it.

Tri-state signals can be beneficially employed in conventional binary logic circuits. Assume an integrated circuit (IC) has two available input/output (I/O) pins. If the pins are connected to a conventional binary receiving circuit, each I/O pin is allowed to be either a zero or a one, providing a total of four possible input combinations (00, 01, 10, 11). However, if the receiving circuit is capable of detecting the three states of a tri-state signal, a total of nine input combinations (00, 01, 0Z, 10, 11, 1Z, Z0, Z1, ZZ, where "Z"=hi-Z) are possible. Tri-state input signals thus increase the amount of information that can be conveyed into a receiving circuit for a given number of pins.

Several circuits have been developed to detect the state of an input signal that can be in one of three states. One such circuit, disclosed in U.S. Pat. No. 5,714,892 to Bowers et al., connects the incoming input signal to a window comparator, with the comparator's high and low threshold voltages established with a resistive divider. Another resistive divider is connected to pull a hi-Z input to a voltage between the low and high thresholds. The comparator outputs are fed to a NAND gate, which goes low for a hi-Z input. The comparator output is fed to a 4-transistor buffer stage along with the input signal; the outputs of the buffer stage and the comparator provide the circuit's two binary outputs.

The Bowers circuit has a number of drawbacks. Due to the large number of components needed for its implementation, it occupies a considerable amount of area on an I.C. die. As die space is expensive, the circuit's complexity incurs a high cost. Furthermore, the circuit is continuously active—i.e., its outputs continuously indicate the state of an input signal, perhaps long after the information is needed. The circuit thus draws current continuously, which can result in a shortened battery life or thermal dissipation problems, for example.

Another approach is found in U.S. Pat. No. 4,449,065 to Davies, Jr. Six transistors are arrayed to detect which of three different voltage levels an input signal is at. The input signal is connected to two of the transistors, a "pre-charge" pulse and its complement are applied to two other transistors, and an "evaluate" pulse and its complement are connected to the last two transistors. The junctions between two pairs of transistors provide the circuit's two binary outputs. The pre-charge pulse initializes the circuit, and the outputs become valid during the evaluate pulse.

The Davies circuit also suffers from a number of shortcomings. For example, the circuit requires an input signal to be within one of three distinct voltage regions to be reliably detected. As such, it is incapable of reliably detecting a hi-Z input signal, which is at an indeterminate voltage. The circuit is thus not useful in detecting tri-state input signals. The circuit also requires the generation of four timing pulses: two pre-charge pulses and two evaluate pulses. The circuitry needed to generate these pulses is not disclosed, but is likely to be complex, consuming both die space and power.

SUMMARY OF THE INVENTION

A tri-state input detection circuit is presented that overcomes the problems noted above. The circuit produces two binary outputs that indicate whether a tri-state input signal is high, low, or in a hi-Z state, while being smaller, less complex, and consuming less power than prior art circuits.

A tri-state input signal is received at an input node, and a pair of transistors conduct respective currents in response to the voltage at the input node. Circuitry is provided to establish the input node at a known voltage when the input signal is in its hi-Z state. Each of the transistors is series-connected to a respective current source, with the two junctions between the transistors and the current sources serving as the circuit's binary outputs.

The transistors and current sources are arranged such that, when on, the transistors conduct all of the current provided by their respective current sources. In operation, a "low" input turns one of the transistors on and the other off; the "on" transistor dominates its current source and pulls its associated output "high", while the current source connected to the "off" transistor pulls its associated output high. A "high" input works similarly, except that the two outputs are pulled low rather than high. When the input signal is in its hi-Z state, the input node is pulled to a voltage that turns on both transistors—both current sources are thereby dominated, producing one "high" and one "low" output.

The relative output impedances between the transistors and their respective current sources set the circuit's input threshold voltages, eliminating the need for a resistive divider. In a preferred embodiment, sampling pulses are used to briefly activate the current sources and the hi-Z circuitry on the input node, with downstream circuitry used to latch the circuit's outputs during the sampling period. This enables the circuit's current consumption to be zero except for the brief period in which the input state is detected and latched. The circuit can be realized exclusively with transistors, insuring that only a small die area is consumed.

The tri-state detection circuit allows a single I/O pin to convey three possible states to an internal logic circuit, possibly reducing the number of I/O pins needed to provide data to a given subcircuit. For example, the present circuit is advantageously used to indicate the selection of one of nine possible bus addresses using only two I/O pins. Each of the I/O pins carries a tri-state input signal and is connected to a respective tri-state input detection circuit. The four binary outputs produced by the detection circuits indicate which of nine bus addresses (3 possible states on 2 I/O pins yield $3^2$ possible combinations) is to be selected based on the states of the two input signals.

Further features and advantages of the invention will be apparent to those skilled in the art from the following detailed description, taken together wit accompanying drawings.

BRIEF DESCRIPTION OF THE DRAWINGS

FIG. 5b is a truth table defining the operation of the I/O pin expander circuit shown in FIG. 5a.

DETAILED DESCRIPTION OF THE INVENTION

Figures 1A, 1B:
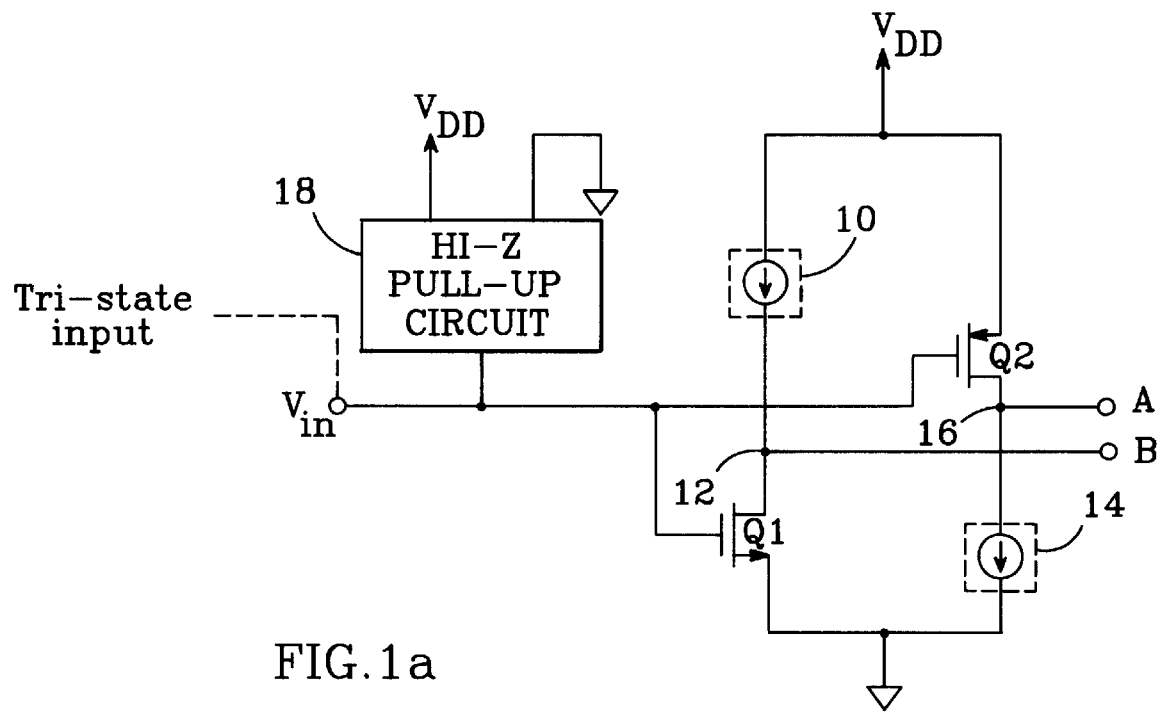
FIG. 1a is a block/schematic diagram of a tri-state input detection circuit per the present invention.
FIG. 1b is a truth table defining the operation of a tri-state input detection circuit per the present invention.

A block/schematic diagram illustrating the operating principles of the present invention is shown in FIG. 1a. An input node $V_{in}$ is connected to receive a tri-state input signal; i.e., a signal that can assume logic "high" ("high"), logic "low" ("low") and "high-impedance" ("hi-Z") states. The control inputs of two opposite-polarity transistors Q1 and Q2 are connected to the input node. Q1 and Q2 are shown as n-channel and p-channel FETs, respectively, but the invention is equally adaptable to implementation with npn and pnp bipolar transistors.

The circuit is powered by a positive supply voltage ("$V_{DD}$") and a negative supply voltage which, as in FIG. 1a, can be ground. Q1's current circuit is connected between the output of a current source 10 and ground; current source 10 is referenced to $V_{DD}$. The junction between current source 10 and Q1 is identified as a node 12. Q2's current circuit is connected between $V_{DD}$ and the output of a current source 14; current source 14 is referenced to ground. The junction between current source 14 and Q2 is identified as a node 16. Nodes 16 and 12 serve as the circuit's outputs, identified as "A" and "B", respectively.

Also connected to input node $V_{in}$ is hi-Z pull-up circuitry 18, which establishes the input node at an intermediate voltage, i.e., a voltage between $V_{DD}$ and ground, when the tri-state input signal is in its hi-Z state. Circuitry 18 is arranged to have little to no effect on a high or low input signal, significantly affecting the voltage at $V_{in}$ only when a hi-Z input is presented.

Transistor Q1 and current source 10 are arranged such that when Q1 is "on", it conducts all of the output current of current source 10 and thus pulls node 12 down. Similarly, Q2 and current source 14 are arranged such that Q2 (when on) conducts all of the current provided by current source 14 and pulls node 16 up. Q1 and Q2 are "on" when their gate-to-source voltages are greater than their respective threshold voltages (if FETs), or their base-emitter junctions are forward-biased (if bipolar). In the exemplary implementation shown in FIG. 1a, current sources 10 and 14 are always on.

In operation, if the tri-state input signal is in its logic low state, Q1 is off and Q2 is on (due to their opposite polarities). With Q1 off, current source 10 drives node 12—and output B—high. With Q2 on, it supplies current to node 16 and current source 14 draws current from the node. But because Q2 conducts all of current source 14's current, node 16—and output A—is driven high.

If the tri-state input signal is high, Q1 is on and Q2 is off. The voltage at node 12 is pulled down as Q1 conducts all of current source 10's current, making output B low. With Q2 off, current source 14 pulls node 16 and output A low.

If the tri-state signal is in its hi-Z state, $V_{in}$ is set to an intermediate voltage by circuitry 18. The intermediate voltage is selected so that both Q1 and Q2 are on. The transistors conduct all of the current provided by their respective current sources, so that output B is pulled low by Q1, and output A is pulled high by Q2.

A truth table defining the operation of the present invention is shown in FIG. 1b. As explained above, a low tri-state input signal makes both outputs high, a high input makes both outputs low, and a hi-Z input makes A high and B low.

The tri-state input detection function performed by the present invention is useful for a number of applications. For example, the circuit can serve as an interface between ternary logic circuits—i.e., circuits using signals that can assume high, low, and hi-Z logic states—and conventional binary logic circuits that use two-state logic signals. The state of a ternary logic circuit's signal is determined by connecting it to input node $V_{in}$ and decoding the detection circuit's A and B outputs.

The tri-state input detection circuit can also be used to minimize I/O pin requirements. Connecting input node $V_{in}$ to an I/O pin that receives a tri-state input enables a one-of-three selection to be made via a single pin. Using x detection circuits in parallel enables a one-of-3x selection to be made using only x I/O pins.

It is essential to the proper operation of the invention that the voltage across Q1 ($V_{ds1}$ for the FET implementation shown) be less than the voltage across current source 10 when Q1 is driven to conduct all of the current provided by current source 10; this is necessary to insure that node 12 is pulled down for a tri-state input signal that is either "high" or in its hi-Z state. Similarly, the voltage across Q2 ($V_{ds2}$) must be less than the voltage across current source 14 when Q2 is driven to conduct all of the current provided by current source 14, to insure that node 16 is pulled up for a tri-state input signal that is either "low" or in its hi-Z state.

The relative output impedances between the transistors and their respective current sources establish the circuit's high and low input threshold voltages. For example, assume that Q1's output impedance when "on" is less than that of current source 10. Then, $V_{ds1}$ when Q1 is fully conducting is less than the voltage across current source 10. Similarly, $V_{ds2}$ when Q2 is fully conducting is less than the voltage across current source 14, assuming Q2's output impedance is less than current source 14's. If both transistors have a threshold voltage of about 0.6 volts, a tri-state input signal greater than 0.6 volts is needed to turn Q1 on sufficiently hard to conduct all of current source 10's current and pull down node 12. Similarly, a tri-state input needs to be less than $V_{DD}$-0.6 volts to turn Q2 on sufficiently hard to conduct all of current source 14's current and pull up node 16. The relative impedances thus establish input threshold voltages for "high" and "low" inputs.

One way in which the high and low input threshold voltages can be moved is by adjusting the relative sizes of the transistors with respect to their respective current sources. Current sources 10 and 14 are typically implemented with respective transistors. To insure that Q1 conducts all of current source 10's current, Q1 is made larger than the transistor implementing current source 10, making Q1's output impedance less than that of current source 10 for equivalent terminal voltages. If the relative difference between the output impedances of Q1 and current source 10 is reduced, the low input threshold voltage moves up toward $V_{DD}/2$. This is because as the output impedances get closer, Q1 must be driven harder— i.e., with a higher input voltage—to conduct enough of the current source 10 current to pull down node 12. Similarly, as Q2's output impedance approaches that of current source 14, the high input threshold voltage moves down toward $V_{DD}/2$. The ability to set the high and low input thresholds by simply adjusting the relative sizes of the transistors and their respective current sources (and thereby their output impedances) eliminates the need for a voltage reference-establishing resistive divider found in some prior art designs.

The relationships between the output impedances (i.e., between a transistor and its respective current source) can also be seen as affecting the output voltages produced by the circuit. Assume that the input threshold voltages are defined the same for a circuit in which the output impedances are greatly unequal and a circuit in which the output impedances are more nearly equal. Because Q1 and Q2 pull harder on their respective nodes when the output impedances are greatly unequal, the margin between a high and low output voltage will be greater. As the gap between the output impedances narrows, the transistors become less dominating, resulting in less margin between a high and low output voltage. The circuitry being driven by the tri-state detection circuit will typically have input threshold voltage requirements; if so, attention must be paid to the relationships between output impedances to insure that the next stage's requirements are met. As used herein, an output is "pulled up" or "pulled down" when its voltage is such that it would be detected as a logic "high" or a logic "low" by the following stage in accordance with that stage's input threshold voltage requirements; properly selected output impedance ratios insure that such requirements are met.

Figure 2:
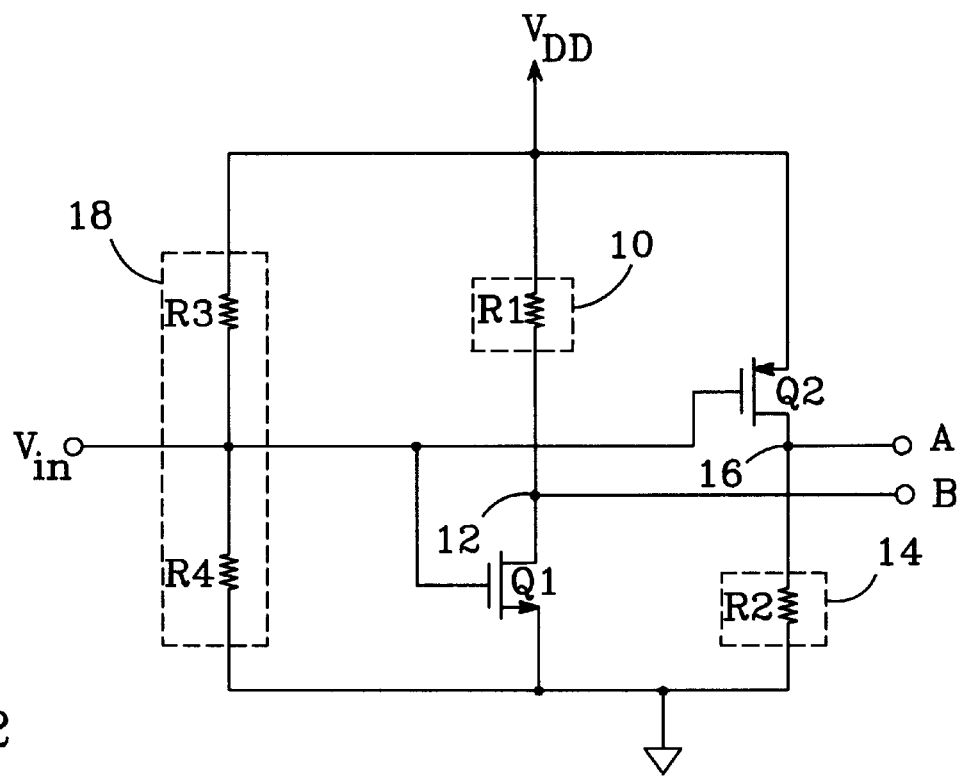
FIG. 2 is a schematic diagram of one embodiment of a tri-state input detection circuit per the present invention.
Figure 3:
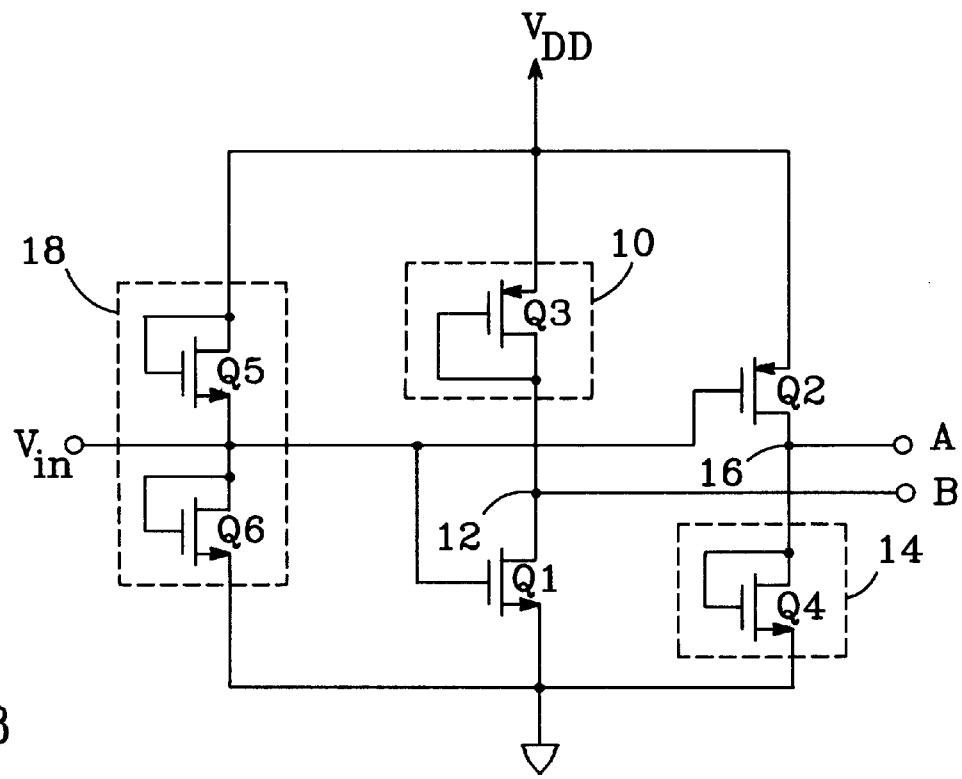
FIG. 3 is a schematic diagram of another embodiment of a tri-state input detection circuit per the present invention.

Two possible embodiments of the new tri-state input detection circuit are shown in FIGS. 2 and 3. In FIG. 2, current source 10 is implemented with a resistor R1, and current source 14 is implemented with a resistor R2. The values of R1 and R2 are selected such that, when Q1 and Q2 are on, they conduct all of the current provided by current sources 10 and 14, respectively.

In FIG. 2, hi-Z pull-up circuitry 18 is implemented with a resistive divider made up of a resistor R3 connected between $V_{DD}$ and $V_{in}$ and a resistor R4 connected between $V_{in}$ and ground. The values of R3 and R4 are preferably about equal, so that a hi-Z input signal produces an intermediate voltage at $V_{in}$ equal to about $V_{DD}/2$. If $V_{DD}$ is equal to at least 1.2 volts, the intermediate voltage produced when R3 and R4 are equal will turn on both Q1 and Q2, as is needed for the circuit to properly indicate a hi-Z input. The values of R3 and R4 should be selected so that, when a hi-Z input is received, the intermediate voltage produced at $V_{in}$ is between the high and low input voltage thresholds established by the transistors and their associated current sources. As noted above, circuitry 18 should be arranged to have little to no effect on a high or low input signal; thus, the currents through R3 and R4 should be limited so that the voltage at $V_{in}$ is significantly affected only when a hi-Z input is presented. When circuitry 18 is implemented with resistors R3 and R4, the intermediate voltage $V_{inter}$ at input node $V_{in}$ is given by:

$$V_{inter} = (R3 * V_{DD})/(R3+R4) \text{ volts.}$$

In FIG. 3, current sources 10 and 14 are implemented with respective transistors Q3 and Q4, each of which is diode-connected. Q3 and Q4 act like resistances, and deliver fairly well-controlled currents to their respective nodes 12 and 16. As noted above, the relative sizes of Q1 and Q3 can be adjusted to establish a relationship between their output impedances which provides desired input threshold voltages; the relative sizes of Q2 and Q4 can be adjusted similarly.

Circuitry 18 is implemented with diode-connected transistors Q5 and Q6 in FIG. 3. Q5 is connected between VDD and input node Vin and Q6 is connected between $V_{in}$ and ground; both Q5 and Q6 act as resistances to pull input node $V_{in}$ to an intermediate voltage when a hi-Z input is presented. To prevent circuitry 18 from adversely affecting a low or high input signal, the currents through Q5 and Q6 should be limited so that the voltage at $V_{in}$ is significantly affected only when a hi-Z input is presented.

For a given tri-state input presented to input node $V_{in}$ of the circuit shown in FIG. 3, the voltages at outputs A and B are calculated in the following way. First, the gain of transistors Q1–Q4 must be determined. The respective gains $\beta_1$ and $\beta_4$ of n-channel FETs Q1 and Q4 are given by:

$$\beta_1 = \mu n * Cox * W_1/L_1 \text{ and}$$

$$\beta_4 = \mu n * Cox * W_4/L_4$$

where $\mu n$ is the mobility of electrons and Cox is the gate oxide capacitance (both constants for an NMOS device), and $W_x/L_x$ are the transistors' width to length ratios.

The respective gains $\beta_2$ and $\beta_3$ of p-channel FETs Q2 and Q3 are given by:

$$\beta_2 = \mu p * Cox * W_2/L_2 \text{ and}$$

$$\beta_3 = \mu p * Cox * W_3/L_3$$

where $\mu p$ is the mobility of holes and Cox is the gate oxide capacitance (both constants for a PMOS device), and $W_x/L_x$ are the transistors' width to length ratios.

As discussed above, when the tri-state input presented at input node $V_{in}$ is low, Q1 is off and thus conducts no current. With Q1 off, Q3's drain-to-source voltage ($V_{ds3}$) will be less than its gate-to-source voltage ($V_{gs3}$) minus its threshold voltage ($V_{T3}$), which causes Q3 to be unsaturated. When unsaturated, Q3's drain current $I_{Q3}$ is given by:

$$I_{Q3} = \beta_3 [(V_{DD}+V_T)*(V_{DD}-V_B)-(V_{DD}-V_B)^2/2]$$

where $V_B$ is the voltage at output B. Assuming that output B drives a hi-Z load, the currents in Q3 and Q1 must be equal. The value of $V_B$ for which this is true is the output voltage for a low input signal. Setting the $I_{Q3}$ equation equal to zero and solving for $V_B$ reveals that $V_B$ is about equal to $V_{DD}$ for a tri-state input signal in its low state.

The output voltage at output A for a low input signal is determined in a similar fashion. Both Q2 and Q4 are on, and since Q2 conducts all of Q4's current to pull up on node 16, Q2 is unsaturated and Q4 is saturated. For this condition, the current in Q2 ($I_{Q2}$) is given by:

$$I_{Q2} = \beta_2[(V_{DD}+V_T)*(V_{DD}-V_A)-(V_{DD}-V_A)^2/2]$$

where $V_A$ is the voltage at output A. The current in Q4 ($I_{Q4}$) is given by:

$$I_{Q4} \beta_4 * V_A^2/2$$

Setting $I_{Q2}$ and $I_{Q4}$ equal and solving for $V_A$ reveals that $V_A$ is also about equal to $V_{DD}$ for a low input. Thus, both of outputs A and B are high for a tri-state input signal in its low state.

A similar analysis can be performed to determine the voltages at outputs A and B for a tri-state input that is in its high or hi-Z states. For example, assuming a $V_{DD}$ of 3 volts and transistor sizes of $W_1/L_1=5$, $W_2/L_2=15$, $W_3/L_3=2/3$, and $W_4/L_4=2/9$, which results in gains of $\beta_1 \approx 6.5 \times 10^{-5}$, $\beta_2 \approx 6.3 \times$ $10^{-5}$, $\beta_3 \approx 2.8 \times 10^{-6}$, and $\beta_4 \approx 2.9 \times 10^{-6}$, voltages are produced at outputs A and B as shown in the table below:

| $V_{in}$ | A (volts) | B (volts) |
|---|---|---|
| low | 2.9 | 3 |
| hi | 0.08 | 0.08 |
| hi-Z | 2.92 | 0.21 |

As discussed above, the characteristics of the transistors and/or their respective current sources can be adjusted to provide necessary noise margins for any following stages, or to adjust the input threshold voltages.

Figure 4:
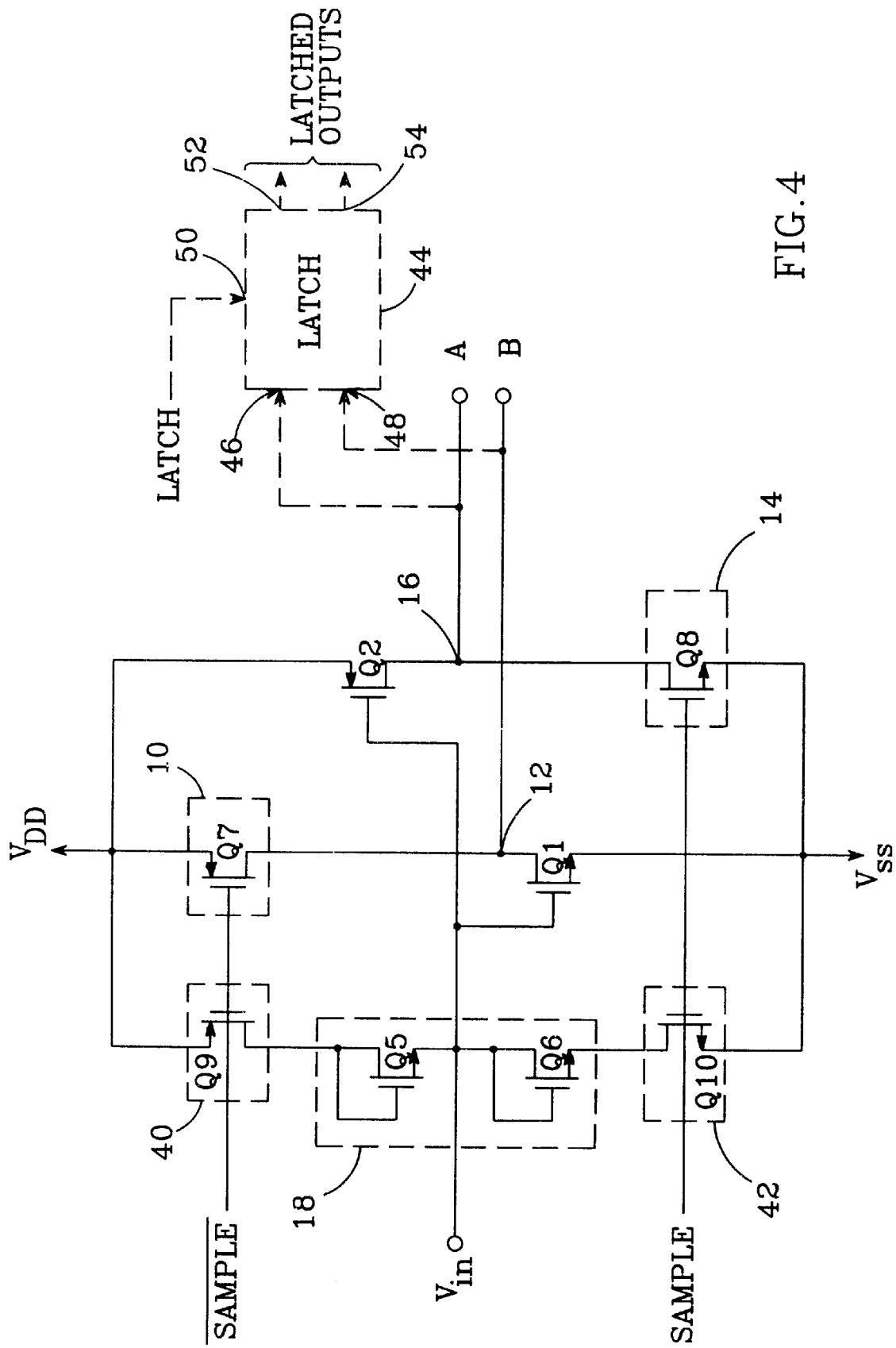
FIG. 4 is a schematic diagram of a preferred embodiment of a tri-state input detection circuit per the present invention.

A preferred embodiment of the invention featuring low-current consumption is shown in FIG. 4. Q1 and Q2 are as before, conducting in response to the voltage present at input node $V_{in}$ and producing outputs B and A at their respective junctions 12 and 16 with current sources 10 and 14. Here, however, current source 10 is implemented with a transistor Q7, connected to provide current to node 12 in response to a signal $\overline{\text{SAMPLE}}$ received at Q7's control input. Current source 14 is similarly implemented with a transistor Q8, connected to supply current to node 16 in response to a signal SAMPLE received at its control input. SAMPLE and $\overline{\text{SAMPLE}}$ are sample pulses that toggle simultaneously, with $\overline{\text{SAMPLE}}$ being the inverse of SAMPLE. Q7 and Q8 are turned on and provide current to nodes 12 and 16, respectively, when SAMPLE goes high and $\overline{\text{SAMPLE}}$ goes low—and are turned off at all other times. The time during which SAMPLE is high and $\overline{\text{SAMPLE}}$ is low is referred to herein as a "sampling period". Using sample pulses in this way results in outputs A and B being valid only during a sampling period, but enables current consumption to be reduced because Q7 and Q8 are not continuously conducting.

A pair of switching devices 40 and 42 are added to the FIG. 4 circuit to further reduce current consumption. Switching device 40 is connected between $V_{DD}$ and circuitry 18 and is closed in response to sample pulse $\overline{\text{SAMPLE}}$. Switching device 42 is connected between circuitry 18 and ground and is closed in response to sample pulse SAMPLE. In the circuits of FIGS. 2 and 3, current was continuously consumed by circuitry 18. Switching devices 40 and 42 permit circuitry 18 to be active only when devices 40 and 42 are closed by the sample pulses. As with switched current sources 10 and 14, the use of switching devices 40 and 42 result in outputs A and B being valid only while the sample pulses are present—i.e., during a sampling period—but enables current consumption to be reduced because circuitry 18 is not continuously active. Switching devices 40 and 42 are preferably implemented with transistors Q9 and Q10, respectively, which are "closed", i.e., allowing current to flow from $V_{DD}$ through circuitry 18 and on to ground, upon receipt of the sample pulses.

In the circuit of FIG. 4, outputs A and B are only valid during a sampling period. To enable the outputs to be useful after a sampling period, a latch circuit 44 can be employed. Latch circuit 44 latches the values presented at its inputs 46 and 48 upon receipt of a LATCH signal at an input 50, and the latched inputs appear at the circuit's outputs 52 and 54. In operation, the state of a tri-state input signal connected to input node $V_{in}$ is detected by toggling sample pulses SAMPLE and $\overline{\text{SAMPLE}}$. This turns on switching devices 40 and 42 and current sources 10 and 14 and outputs A and B become valid. Prior to the end of a sampling period, a LATCH signal is applied to latch circuit 44 to latch outputs A and B. The latched outputs appear at the outputs 52, 54 of the latch circuit, and can then be used when needed by other, downstream circuitry.

Figure 5A:
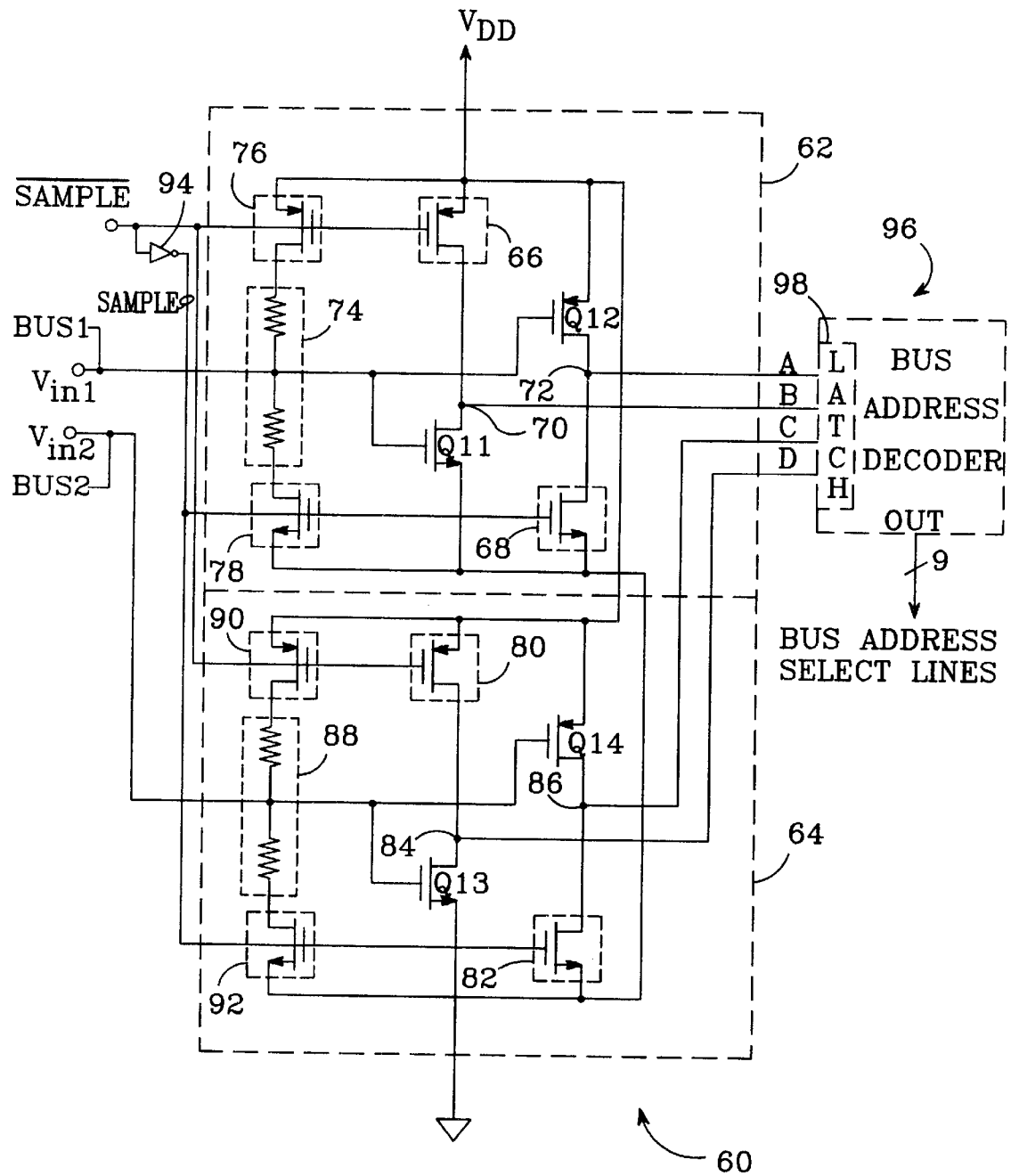
FIG. 5a is a schematic diagram of an I/O pin expander circuit which use a plurality of tri-state input detection circuits per the present invention.

An I/O pin expander circuit 60 built from tri-state level detection circuits per the present invention is shown in FIG. 5a. A circuit of this type might be used, for example, to set a bus address using the fewest possible I/O pins. In this example, two tri-state input detection circuits 62 and 64 are used to allow one of nine possible bus addresses to be selected using only two I/O pins.

Detection circuit 62 receives a first address select signal BUS1 at its input node $V_{in1}$ and detection circuit 64 receives address select signal BUS2 at its input node $V_{in2}$. Both BUS1 and BUS2 are tri-state signals, capable of being in either high, low, or hi-Z states. Detection circuits 62 and 64 are arranged in a low-current consumption configuration similar to that shown in FIG. 4. Detection circuit 62 includes transistors Q11 and Q12 connected to $V_{in1}$, with their respective current circuits connected to current sources 66 and 68 at nodes 70 and 72, respectively. Hi-Z pull-up circuitry 74 is connected to pull up input node $V_{in1}$ when BUS1 is in its hi-Z state—when powered via switching devices 76 and 78 upon receipt of sampling pulses SAMPLE and $\overline{\text{SAMPLE}}$.

Detection circuit 64 includes transistors Q13 and Q14 connected to $V_{in2}$, with their respective current circuits connected to current sources 80 and 82 at nodes 84 and 86, respectively. Circuitry 88 is connected to pull up input node $V_{in2}$ when BUS2 is in its hi-Z state; switching devices 90 and 92 are connected to power circuitry 88 upon receipt of sampling pulses SAMPLE and $\overline{\text{SAMPLE}}$. $\overline{\text{SAMPLE}}$ is preferably generated by inverting the SAMPLE pulse, using, for example, an inverter 94.

Each detection circuit provides two outputs: detection circuit 62 produces outputs A and B at its junctions 72 and 70, respectively, and detection circuit 64 produces outputs C and D at its junctions 86 and 84, respectively. Outputs A–D are preferably fed to a bus address decoder circuit 96, which includes a latch circuit 98. As discussed above, the latch circuit 98 latches the A–D outputs while they are valid, i.e., when SAMPLE is low and $\overline{\text{SAMPLE}}$ is high.

A truth table for the circuit of FIG. 5a is shown in FIG. 5b, which depicts the nine possible combinations of BUS1 and BUS2, and the resulting binary outputs A–D. The number of possible binary outputs that a circuit of the type shown in FIG. 5a can produce is equal to $3^x$, where x is equal to the number of input nodes. The circuit of FIG. 5a has two input nodes ($V_{in1}$, $V_{in2}$), and thus has $3^2=9$ possible outputs. Bus address decoder circuit 96 thus outputs nine BUS ADDRESS SELECT lines, each of which can be individually selected by providing the appropriate tri-state input signals at BUS1 and BUS2. In a pure binary logic system, a one-of-nine decoder requires four binary inputs and thus making a selection would require four I/O pins. The invention enables the same selection capability, while requiring only two I/O pins. This reduction in I/O pin requirements reduces the die space required, which frees die space up for other purposes and lowers cost.

The circuit shown in FIG. 5a is merely exemplary. Greater selection capability and/or further reductions in I/O pin usage can be realized with the use of additional detection circuits. The detection circuits can be implemented with bipolar transistors instead of FETs, a combination of bipolar transistors and FETs, or with FETs of the opposite polarity from that shown (assuming the supply voltages and circuit topology is inverted).

While particular embodiments of the invention have been shown and described, numerous variations and alternate embodiments will occur to those skilled in the art. Accordingly, it is intended that the invention be limited only in terms of the appended claims.

We claim:

1. A tri-state input detection circuit, comprising:

an input node for receiving a tri-state input signal, a first transistor connected to conduct a current in response to the voltage at said input node, a first current source connected to the current circuit of said first transistor at a first junction, said first transistor and said first current source arranged such that said first transistor pulls down the voltage at said first junction when the voltage at said input node is above a first threshold voltage and said first current source pulls up the voltage at said first junction when the voltage at said input node is below said first threshold voltage, a second transistor connected to conduct a current in response to the voltage at said input node, a second current source connected to the current circuit of said second transistor at a second junction, said second transistor and said second current source arranged such that said second transistor pulls up the voltage at said second junction when the voltage at said input node is below a second threshold voltage and said second current source pulls down the voltage at said second junction when the voltage at said input node is above said second threshold voltage, wherein said first and second current sources are third and fourth transistors, said third transistor fabricated to have a higher output impedance than said first transistor for equivalent terminal voltages, and said fourth transistor fabricated to have a higher output impedance than said second transistor for equivalent terminal voltages, said first threshold voltage varying with the ratio between the impedances of said first transistor and said third transistor and said second threshold voltage varying with the ratio between the impedances of said second transistor and said fourth transistor, said third and fourth transistors further connected to receive respective sampling signals and are turned on in response to said sampling signals, and pull-up circuitry connected to said input node to establish an intermediate voltage at said input node that is above said first threshold voltage and below said second threshold voltage when said input signal is in a high-impedance state, said voltages at said first and second junctions indicating the state of said tri-state input signal when said third and fourth transistors are on.

2. The detection circuit of claim 1, wherein said pull-up circuitry comprises a pair of series-connected resistances connected between a first supply voltage and a second supply voltage, said input node being at the junction of said pair of resistances.

3. The detection circuit of claim 2, further comprising a first switching device which connects one of said resistances to said first supply voltage and a second switching device which connects the other of said resistances to said second supply voltage, said intermediate voltage established at said input node when said input signal is in a high-impedance state only when said switching devices are closed.

4. The detection circuit of claim 1, wherein said pull-up circuitry comprises a pair of series-connected transistors connected between a first supply voltage and a second supply voltage, said input node being at the junction of said pair of transistors, each of said pair of series-connected transistors being diode-connected.

5. The detection circuit of claim 1, wherein said first and said second transistors are of opposite polarity.

6. A tri-state input detection circuit, comprising:

an input node for receiving a tri-state input signal, a first transistor connected to conduct a current in response to the voltage at said input node, a first current source connected to the current circuit of said first transistor at a first junction, said first transistor and said first current source arranged such that said first transistor pulls down the voltage at said first junction when the voltage at said input node is above a first threshold voltage and said first current source pulls up the voltage at said first junction when the voltage at said input node is below said first threshold voltage, a second transistor connected to conduct a current in response to the voltage at said input node, a second current source connected to the current circuit of said second transistor at a second junction, said second transistor and said second current source arranged such that said second transistor pulls up the voltage at said second junction when the voltage at said input node is below a second threshold voltage and said second current source pulls down the voltage at said second junction when the voltage at said input node is above said second threshold voltage, pull-up circuitry connected to said input node to establish an intermediate voltage at said input node that is above said first threshold voltage and below said second threshold voltage when said input signal is in a high-impedance state, said pull-up circuitry comprising a pair of series-connected resistances connected between a first supply voltage and a second supply voltage, said input node being at the junction of said pair of resistances, a first switching device which connects one of said resistances to said first supply voltage, and a second switching device which connects the other of said resistances to said second supply voltage, said intermediate voltage established at said input node when said input signal is in a high-impedance state only when said switching devices are closed, wherein said first switching device is a third transistor and said second switching device is a fourth transistor, said third and said fourth transistors receiving respective sampling signals and are turned on to connect said resistances to said supply voltages in response to said sampling signals, the voltages at said first and said second junctions indicating the state of said tri-state input signal.

7. A tri-state input detection circuit, comprising:

an input node for receiving an input signal that can be in a logic "high" state, a logic "low" state, or a high-impedance state, a pair of series-connected resistances connected between a first supply voltage and a second supply voltage, the junction of said resistances being said input node, said pair of resistances establishing said input node at an intermediate voltage when said input signal is in said high-impedance state, a first transistor connected to conduct a current in response to the voltage at said input node, a second transistor arranged to provide current to said first transistor at a first junction, said first transistor being larger than and thereby capable of conducting more current than said second transistor for equivalent terminal voltages, said first transistor and said second transistor arranged such that said first transistor conducts all of said second transistor's current and pulls down the voltage at said first junction when said input signal is in said logic "high" state or said high-impedance state and said first transistor conducts less than all of said second transistor's current such that said second transistor pulls up the voltage at said first junction when said input signal is in said logic "low" state, a third transistor connected to conduct a current in response to the voltage at said input node, said first and said third transistors being of opposite polarity, a fourth transistor arranged to provide current to said third transistor at a second junction, said third transistor being larger than and thereby capable of conducting more current than said fourth transistor for equivalent terminal voltages, said third transistor and said fourth transistor arranged such that said third transistor conducts all of said fourth transistor's current and pulls up the voltage at said second junction when said input signal is in said logic "low" state or said high-impedance state and said third transistor conducts less than all of said fourth transistor's current such that said fourth transistor pulls down the voltage at said second junction when said input signal is in said logic "high" state, wherein said second and fourth transistors are turned on in response to respective sampling signals received at their respective control inputs, the voltages at said first and said second junctions indicating the state of said tri-state input signal when said sampling signals turn on their respective transistors.

8. The detection circuit of claim 7, further comprising a latch circuit connected to said first and said second junctions and arranged to latch the logic states of said junctions while said second and said fourth transistors and turned on by their respective sampling signals.

9. The detection circuit of claim 7, wherein said first transistor and said second transistor are series-connected between a first supply voltage and a second supply voltage and the voltage across said first transistor is less than the voltage across said second transistor when said first transistor is conducting all of the current provided by said second transistor, and said third transistor and said fourth transistor are series-connected between said first supply voltage and said second supply voltage and the voltage across said third transistor is less than the voltage across said fourth transistor when said third transistor is conducting all of the current provided by said fourth transistor.

10. The detection circuit of claim 7, wherein said pair of series-connected resistances comprise fifth and sixth transistors, each of said fifth and sixth transistors being diode-connected.

11. The detection circuit of claim 7, further comprising a first switching device which connects one of said resistances to said first supply voltage and a second switching device which connects the other of said resistances to said second supply voltage, said intermediate voltage established at said input node when said input signal is in a high-impedance state only when said switching devices are closed.

12. A tri-state input detection circuit, comprising:
an input node for receiving an input signal that can be in a logic "high" state, a logic "low" state, or a high-impedance state,
a pair of series-connected resistances connected between a first supply voltage and a second supply voltage, the junction of said resistances being said input node, said pair of resistances establishing said input node at an intermediate voltage when said input signal is in said high-impedance state,
a first transistor connected to conduct a current in response to the voltage at said input node,
a second transistor arranged to provide current to said first transistor at a first junction, said first transistor being larger than and thereby capable of conducting more current than said second transistor for equivalent terminal voltages, said first transistor and said second transistor arranged such that said first transistor conducts all of said second transistor's current and pulls down the voltage at said first junction when said input signal is in said logic "high" state or said high-impedance state and said first transistor conducts less than all of said second transistor's current such that said second transistor pulls up the voltage at said first junction when said input signal is in said logic "low" state,
a third transistor connected to conduct a current in response to the voltage at said input node, said first and said third transistors being of opposite polarity,
a fourth transistor arranged to provide current to said third transistor at a second junction, said third transistor being larger than and thereby capable of conducting more current than said fourth transistor for equivalent terminal voltages, said third transistor and said fourth transistor arranged such that said third transistor conducts all of said fourth transistor's current and pulls up the voltage at said second junction when said input signal is in said logic "low" state or said high-impedance state and said third transistor conducts less than all of said fourth transistor's current such that said fourth transistor pulls down the voltage at said second junction when said input signal is in said logic "high" state,
a first switching device which connects one of said resistances to said first supply voltage, and
a second switching device which connects the other of said resistances to said second supply voltage, said intermediate voltage established at said input node when said input signal is in a high-impedance state only when said switching devices are closed,
said first and said second switching devices comprising fifth and sixth transistors which are turned on in response to respective sampling signals received at their respective control inputs, said intermediate voltage established at said input node when said input signal is in a high-impedance state only when said fifth and sixth transistors are turned on,
the voltages at said first and said second junctions uniquely identifying the state of said tri-state input signal.

13. An input/output (I/O) pin expander circuit, comprising:
a plurality of I/O pins, and
a plurality of tri-state input detection circuits connected to respective ones of said I/O pins, each of said tri-state input detection circuits comprising:
an input node connected to said detection circuit's respective I/O pin for receiving a tri-state input signal that can be in a logic "high" state, a logic "low" state, or a high-impedance state,
a first transistor connected to conduct a current in response to the voltage at said input node, a first current source connected to the current circuit of said first transistor at a first junction, said first transistor and said first current source arranged such that said first transistor pulls down the voltage at said first junction when the voltage at said input node is above a first threshold and said first current source pulls up the voltage at said first junction when the voltage at said input node is below said first threshold, a second transistor connected to conduct a current in response to the voltage at said input node, a second current source connected to the current circuit of said second transistor at a second junction, said second transistor and said second current source arranged such that said second transistor pulls up the voltage at said second junction when the voltage at said input node is below a second threshold and said second current source pulls down the voltage at said second junction when the voltage at said input node is above said second threshold, wherein said first and second current sources are third and fourth transistors, said third transistor fabricated to have a higher output impedance than said first transistor for equivalent terminal voltages, and said fourth transistor fabricated to have a higher output impedance than said second transistor for equivalent terminal voltages, said first threshold voltage varying with the ratio between the impedances of said first transistor and said third transistor and said second threshold voltage varying with the ratio between the impedances of said second transistor and said fourth transistor, said third and fourth transistors further connected to receive respective sampling signals and are turned on in response to said sampling signals, and pull-up circuitry connected to said input node to establish an intermediate voltage at said input node that is above said first threshold voltage and below said second threshold when said input signal is in a high-impedance state, said first and second junctions being the outputs of said tri-state input detection circuit, the voltages at said first and said second junctions uniquely identifying the state of said tri-state input signal presented to said detection circuit's respective I/O pin when said third and fourth transistors are on, said I/O pin expander circuit having x input pins receiving a total of x tri-state input signals and producing 2x outputs, said 2x outputs being decodable to indicate which of $3^x$ possible combinations of said tri-state input signals is presented at said I/O pins.

14. The expander circuit of claim 13, further comprising a latch circuit connected to said outputs and arranged to latch the logic states of said outputs when they accurately indicate which one of $3^x$ possible combinations of said tri-state input signals is presented at said I/O pins.

15. The expander circuit of claim 13, further comprising a decoder circuit connected to receive said 2x outputs and which toggles one of $3^x$ decoder output lines in accordance with the states of said 2x outputs.

* * * * *